United States Patent [19]

James

[11] 4,017,742
[45] Apr. 12, 1977

[54] MULTIPLE INPUT, MULTIPLE FAILURE OPERATIONAL VOTER CIRCUIT

[75] Inventor: Robert L. James, Bloomfield, N.J.

[73] Assignee: The Bendix Corporation, Teterboro, N.J.

[22] Filed: Mar. 28, 1975

[21] Appl. No.: 563,260

[52] U.S. Cl. .............................. 307/357; 307/359; 328/117; 328/137; 328/147

[51] Int. Cl.² ...................................... H03K 5/20

[58] Field of Search ....... 307/235 F, 235 G, 235 K; 328/93, 97, 116, 117, 137, 146–148

[56] References Cited

UNITED STATES PATENTS

| | | | |
|---|---|---|---|
| 3,530,381 | 9/1970 | Hogg et al. ..................... | 328/146 X |
| 3,551,824 | 12/1970 | Rotier ............................. | 307/235 F |
| 3,667,057 | 5/1972 | Pfersch, Jr. et al. ........... | 307/235 K |
| 3,858,199 | 12/1974 | Neuner et al. .................. | 307/235 G |

Primary Examiner—John Zazworsky
Attorney, Agent, or Firm—Anthony F. Cuoco

[57] ABSTRACT

A circuit configuration for providing an analog output signal at any instant in time, and which is equal in magnitude to a selected signal of a plurality of analog input signals. If any one of the input signals are unwanted the circuit "votes" or ignores the unwanted signal. The voting is repeated until a predetermined number of signals remain, irrespective of the original number of input signals, whereupon the output signal is selected from the remaining signals.

9 Claims, 1 Drawing Figure

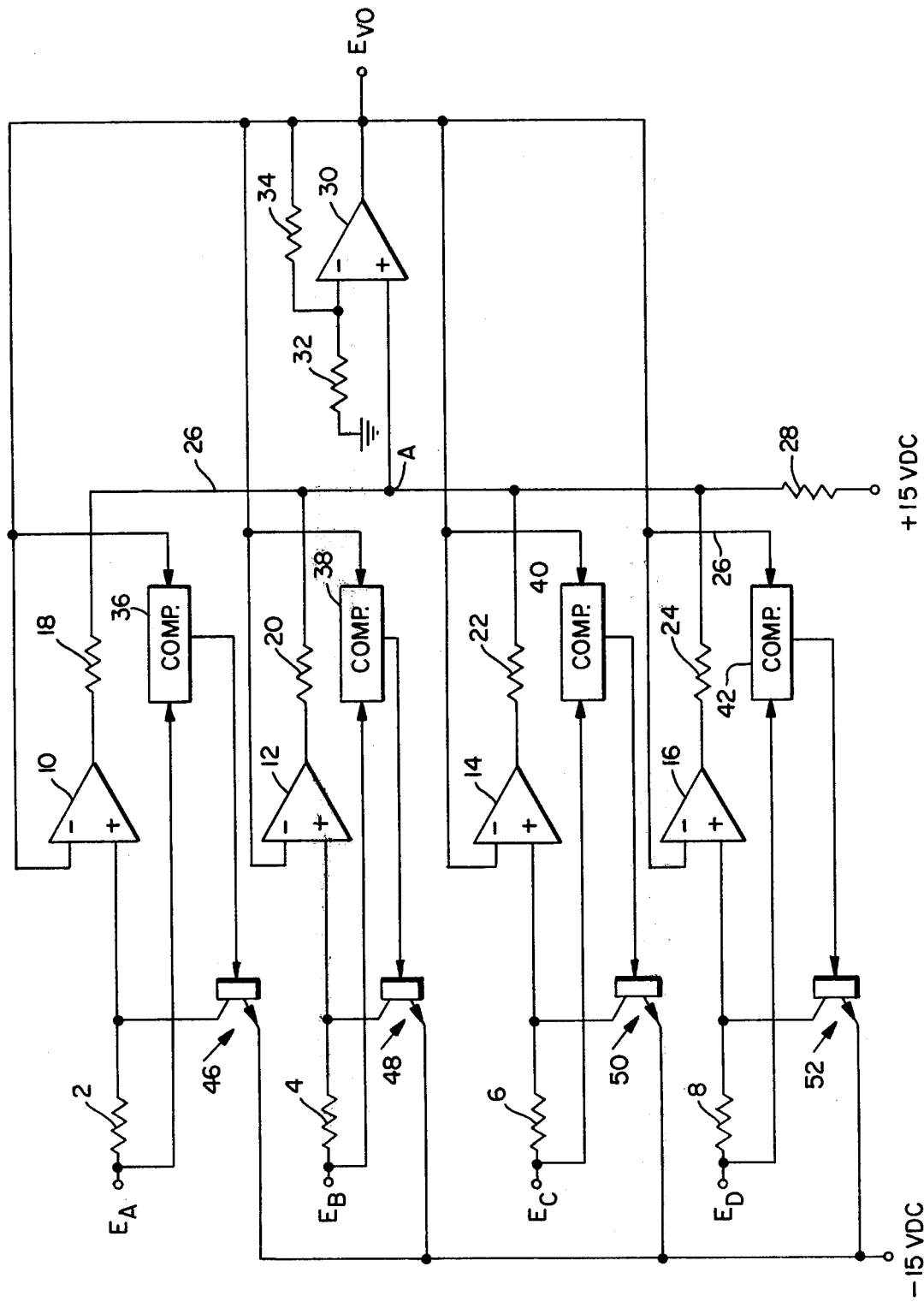

MULTIPLE INPUT, MULTIPLE FAILURE OPERATIONAL VOTER CIRCUIT

BACKGROUND OF THE INVENTION

1. Field of the Invention

This invention relates generally to voter circuits and particularly to voter circuits responsive to a plurality of input signals for providing a "voted" or wanted output signal. More particularly, this invention relates to a mutliple input, multiple failure operational voter circuit providing the advantages of increased accuracy without the need for precision components and complicated circuitry.

2. Description of the Prior Art

Prior art voter circuits of the type described suffer from the disadvantages of complexity, the need for precision components, inversion of signal polarity from input to output and relatively unstable circuit characteristics. The device of the invention accomplishes the required voting simply and precise, and without the aforenoted disadvantages.

SUMMARY OF THE INVENTION

This invention contemplates a multiple input, multiple failure operational voter circuit wherein there is provided at any instant of time an output signal equal in magnitude to a selected signal of a plurality of input signals. If any one of the other signals are unwanted the circuit "votes" or, in other words, ignores the unwanted signal. The unwanted signal is then detected by comparing it with the output of the circuit, and which ouput is equivalent to one of the remaining wanted signals. Upon said detection, the unwanted input signal is switched to a maximum fixed d.c. level, whereby the cirucit is able to vote on or ignore a second unwanted signal. Another comparison is made, whereupon the second unwanted signal is switched to the maximum fixed d.c. level and if there are more than a predtermined number of wanted input signals remaining, a third signal may be similarly voted on and ignored. In this manner, the voting process is repeated until only a predetermined number of wanted signals remain, irrespective of the original number of input signals to the circuit. The circuit output signal is selected from the remaining input signals. The voting law for such a circuit has a requirement that the original number of inputs be an odd number. Thus, a four input voter circuit, for example, would require a dummy input to provide the required odd number of inputs. This dummy input can conveniently be a maximum fixed d.c. level which does not have to be switched as aforenoted. As a further example, a five input voter circuit (five inputs being an odd number) would need no such dummy input.

The main object of this invention is to provide a voter circuit configuration for providing at any instant of time an output signal equal in magnitude to a selected signal of a plurality of input signals.

Another object of this invention is to accomplish the above with simplicity and accuracy, and without the need for precision components.

Another object of this invention is to provide a circuit configuration of the type described which is adaptable for hybrid circuit fabrication without inversion of signal polarity from input to output and with greater circuit stability.

The foregoing and other objects and advantages of the invention will appear more fully from a consideration of the detailed description which follows, taken together with the accompanying drawings wherein one embodiment of the invention is illustrated by way of example. It is to be expressly understood, however, that the drawing is for illustration purpose only and is not to be construed as defining the limits of the invention.

DESCRIPTION OF THE DRAWING

The single figure in the drawing is a combination block diagram electrical schematic of a voter circuit configuration according to the invention.

DESCRIPTION OF THE INVENTION

For illustrative purposes only, a four input, two failure operational voter circuit will be described with reference to the drawing. It will be understood that the principles disclosed apply equally as well to any other multiple input, multiple failure operational circuits, as the same will be understood by those skilled in the art.

Analog input signals $E_A$, $E_B$, $E_C$, and $E_D$ are applied through resistors 2, 4, 6, and 8 to the non-inverting input terminals (+) of operational amplifiers 10, 12, 14 and 16, respectively. The outputs of operational amplifiers 10, 12, 14 and 16 are connected through resistors 18, 20, 22 and 24, respectively, to a conductor 26, which in turn is connected through a load resistor 28 to a dummy input which is shown, for purposes of illustration, as being +15 volts d.c.

Conductor 26 is connected to the noninverting (+) input terminal of an output operational amplifier 30. The inverting input terminal (−) of amplifier 30 is connected through a resistor 32 to ground. A feedback resistor 34 is connected to the output of amplifier 30 and to a point intermediate resistor 32 and the inverting input terminal (−) of the amplifier. An analog "voted" output signal $E_{VO}$ is provided at the output of amplifier 30.

Input signals $E_A$, $E_B$, $E_C$, and $E_D$ are applied to conventional type compartors 36, 38, 40 and 42, respectively. Signal $E_{VO}$ at the output of amplifier 30 is applied to the inverting input terminals (−) of amplifiers 10, 12, 14 and 16, and is applied to comparators 36, 38, 40 and 42.

Comparator 36 compares the inputs applied thereto and when the inputs differ by a predetermined threshold provides an output which is applied to the base element of a switching transistor 46. Comparator 38 compares the inputs applied thereto and when the inputs differ by a predetermined threshold provides an output which is applied to the base element of a switching transistor 48. Comparator 40 compares the inputs applied thereto and when the inputs differ by a predetermined threshold provides an output which is applied to the base element of a switching transistor 50 and comparator 42 compares the inputs applied thereto and when said inputs differ by a predetermined threshold provides an output which is applied to the base element of a switching transistor 52.

The collector element of transistor 46 is connected intermediate resistor 2 and the non-inverting input (+) of amplifier 10, the collector element of transistor 48 is connected intermediate resistor 4 and the non-inverting (−) input terminal of amplifier 12, the collector of transistor 50 is connected intermediate resistor 6 and the non-inverting (+) input terminal of amplifier 14, and the collector element of transistor 52 is connected intermediate resistor 8 and the non-inverting imput terminal (+) of amplifier 16. The emitter elements of transistors 46, 48, 50 and 52 are connected to, for example, a −15 volt d.c. source which is a maximum fixed d.c. level having a purpose to be hereinafter explained.

In connection with the aforegoing description of the invention it will be noted that amplifiers 10, 12, 14 and 16 may be conventional operational amplifiers connected in voltage follower configuration while comparators 36, 38, 40 and 42 may likewise be conventional operational amplifier arrangements which provide logic outputs applied to the base elements of transistors 46, 48, 50 and 52, respectively, when the inputs to the comparators differ by a predetermined threshold as aforenoted. Likewise, amplifier 30 is a conventional operational amplifier of the type having a feedback connection as shown in the drawing.

OPERATION OF THE INVENTION

It will be seen from the drawing and the foregoing description of the invention that a common feedback voltage, i.e. $E_{VO}$, is applied directly to the inverting (−) input terminals of each of the amplifiers 10, 12, 14 and 16. For these amplifiers to operate in their linear region, i.e. not saturated in either the positive or negative senses at their outputs, inputs $E_A$, $E_B$, and $E_D$ applied to the non-inverting (+) input terminals of amplifiers 10, 12, 14 and 16, respectively, must equal the common feedback voltage at the inverting input terminals within a few millivolts.

Assuming tht input signals $E_A$, $E_B$, $E_C$, and $E_D$ applied to the respective amplifiers are not equal, which is the situation concerning the purposes of the invention, only one of the amplifiers 10, 12, 14 and 16 will adjust its output, and hence the common feedback voltage applied to the inverting input terminal (−) of this one amplifier is within a range for the aforenoted linear operation. The other amplifiers will not operate in ther linear region, but will be saturated in either a positive or negative sense at their outputs depending on whether their inputs are greater or less than the common feedback voltage. This saturation occurs only a long as there are many positive saturations as negative saturations among the amplifier outputs. In this connection it is noted that the +15 volt d.c. dummy input acts as another positive saturation output. This is due to the fact that the contributions of the saturated outputs to the voltage at point A shown in the figure will cancel, leaving only the contributions of the linear operating amplifiers to determine the common feedback voltage ($E_{VO}$).

It is further noted that even if the positive and negative saturation outputs do not exactly cancel (which is generally the case) the common feedback voltage adjusts itself so as to be equal to one of the amplifier inputs to within a few millivolts, or else, hypothetically at least, the one amplifier also would saturate and provide an extra saturated output. In the configuration shown this could not, of course, occur since the one amplifier would drive itself by negative feedback to where the amplifier again was within linear operation as in normal feedback amplifier action.

Instead, the effect of a slight unbalance of positive and negative saturations causes output $E_{VO}$ at the output of amplifier 30, which is a linearly operating amplifier, to differ only slightly from what it is when the saturations exactly balance. In this connection it is noted that the gain of amplifier 30 serves the purposes of making up for attenuation due to the isolating resistors 18, 20, 22, 24 and 28 so that sufficient feedback (unity gain feedback) can be developed around linearly operating amplifier 30 to maintain said amplifier out of the hypothetical saturation situation above described. Without the gain of amplifer 30, the input signal range will have to be severly limited to prevent the amplifier from saturating. Thus, it is seen that the gain of amplifier 30 has no great accuracy requirement as long as it is large enough to prevent the aforenoted saturation. Consequently, gain resisstor 34 and resistors 18, 20, 22, 24 and 28 need not be precision resistors. This feature makes the disclosed cirucit configuration attractive for hybrid fabrication as will be understood by those skilled in the art.

In the particular circuit configuration shown in the drawing and the aforegoing description thereof, output signal $E_{VO}$, at any instant in time, is equal to the next to the most positive valued signal of input signals $E_A$, $E_B$, $E_C$ and $E_D$. Thus, if any of the other input signals are unwanted, the unwanted signal is detected by comparing it with the output signal via comparators 36, 38, 40 or 42, as the case may be, with the output signal being equivalent to one of the remaining good signals. After the detection, the unwanted signal is switched via transistors 46, 48, 50 or 52, as the case may be, to the maximum fixed negative d.c. level (−15V d.c.). A second unwanted signal then can be detected via the appropriate comparator and switched to the maximum negative d.c. level via the appropriate transistor. With only two good signals remaining, the circuit configuration shown selects the most negative of these and still provides a good output signal $E_{VO}$. Finally, if one of these remaining signals goes bad and differs from the other by going positive, the circuit still selects the next to the most positive signal and provides a good output signal. Thus, the circuit shown, receives four input signals and is described as "two failure" operational.

It will now be discerned that since the disclosed circuitry is symmetrical, it can be made to select the next to the most negative input instead of the next to the most positive input signal as aforenoted, simply by changing the polarity of the dummy output from +15 volts d.c. to −15 volts d.c. and by switching unwanted inputs to a maximum fixed positive voltage instead of to a maximum fixed negative voltage as previously described. This symmetrical feature is of inportance for practical hardware consideration for the signal switching. Likewise, switching transistors 46, 48, 50 and 52 may be NPN (as shown) or PNP transistors upon the reversal of polarity of the disclosed circuit as noted.

The device of the invention provides a unique voter circuit configuration providing the advantages of simplicity and accuracy without the need for precision components. Unwanted (bad) signals are prevented at the output of the circuitry by the simple expedient of connecting an input signal to the most negative or positive signal level ever to be expected, whereupon this signal would be the last to be selected by the voting laws if the circuit.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. Apparatus for providing a voted output signal at any instant in time, and which signal corresponds to a selected signal of a plurality of input signals, comprising:

a plurality of amplifiers, each of which receives one of the plurality of input signals and receives the voted output signal as feedback, and provides an output signal in accordance with the received signals;

a plurality of comparators, each of which compares the voted output signal with a corresponding one of the plurality of input signals and provides a signal when the difference between the compared signals exceeds a predetermined threshold, said signal being indicative of an unwanted input signal; and a plurality of switching means, each of which receives a corresponding one of the plurality of input signals and is connected to a corresponding comparator and to a maximum fixed signal level means, and is responsive to the comparator signal indicative of an unwanted signal for switching the unwanted input signal to the maximum fixed signal level.

2. Apparatus as described by claim 1, including:
means for providing a dummy input signal when the plurality of input signals is an odd number; and
each of the plurality of amplifiers has an output terminal connected to the dummy input signal means.

3. Apparatus as described by claim 1, including:
an output amplifier for receiving the output signals in accordance with the recieved signals from the plurality of amplifiers and for providing the voted signal in response thereto.

4. Apparatus as described by claim 3, wherein:
the output amplifier includes an inverting input terminal, a non-inverting input terminal and an output terminal;

the non-inverting input terminal receives the output signals in accordance with the received signals from the plurality of amplifiers;
the output terminal provides the voted output signal;
the output terminal is connected through a resistor in feedback relation to the inverting input terminal; and
the inverting input terminal is connected through a resistor to ground.

5. Apparatus as described by claim 1, wherein:
each of the plurality of amplifiers has an inverting input terminal and a non-inverting input terminal;
the voted output signal is received at the inverting input terminal; and
the one of the plurality of input signals is received through a resistor to the non-inverting input terminal.

6. Apparatus as described by claim 5, wherein each of the plurality of switching means is a transistor including:
a collector connected intermediate the resistor and the non-inverting input terminal of the amplifier;
a base connected to the corresponding comparator; and
an emitter connected to the maximum fixed level signal means.

7. Apparatus as described by claim 1, wherein:
each of the plurality of amplifiers operates in its linear region when the voted output signal received thereby as feedback is substantially equal to the input signal received thereby.

8. Apparatus as described by claim 7, wherein:
the outputs of the amplifiers operating in their linear region determine the voted output signal.

9. Apparatus as described by claim 3, including:
a plurality of isolating resistors, each of which is connected to a corresponding amplifier of the plurality of amplifiers and to the output amplifier; and
the output signal from the corresponding amplifier being applied to the output amplifier through the corresponding resistor.

* * * * *